US010931292B1

(12) United States Patent
Shalmani et al.

(10) Patent No.: US 10,931,292 B1
(45) Date of Patent: Feb. 23, 2021

(54) HIGH RESOLUTION SUCCESSIVE APPROXIMATION REGISTER ANALOG TO DIGITAL CONVERTER WITH FACTORING AND BACKGROUND CLOCK CALIBRATION

(71) Applicant: Ciena Corporation, Hanover, MD (US)

(72) Inventors: Soheyl Ziabakhsh Shalmani, Kanata (CA); Hazem Beshara, Ottawa (CA); Mohammad Honarparvar, Gatineau (CA); Sadok Aouini, Gatineau (CA); Christopher Kurowski, Nepean (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/930,598

(22) Filed: May 13, 2020

(51) Int. Cl.
*H03M 1/10* (2006.01)
*H03M 1/00* (2006.01)
*H03M 1/06* (2006.01)
*H03M 1/12* (2006.01)

(52) U.S. Cl.
CPC .......... *H03M 1/1033* (2013.01); *H03M 1/001* (2013.01); *H03M 1/06* (2013.01); *H03M 1/10* (2013.01); *H03M 1/12* (2013.01); *H03M 1/124* (2013.01)

(58) Field of Classification Search
CPC ............ H03M 1/10; H03M 1/12; H03M 1/06; H03M 1/001; H03M 1/124
USPC ................. 341/120, 155, 118, 110, 122, 126
See application file for complete search history.

(56) References Cited

U.S. PATENT DOCUMENTS 8,344,925 B1 * 1/2013 Evans ................... H03M 1/462
341/155

OTHER PUBLICATIONS

Brian P. Ginsburg ; Anantha P. Chandrakasan, "500-MS/s 5-bit ADC in 65-nm CMOS With Split Capacitor Array DAC", IEEE Journal of Solid-State Circuits ,vol. 42 , Issue: 4 , Apr. 2007.
Wan Kim, et al., "A 0.6 V 12 b 10 MS/s Low-Noise Asynchronous SAR-Assisted Time-Interleaved SAR (SATI-SAR) ADC," IEEE journal of solid-state circuits, vol. 51, No. 8, Aug. 2016.
Hua Fan, and Franco Maloberti, "High-Resolution SAR ADC with Enhanced Linearity," IEEE transactions on circuits and systems—II: express briefs, vol. 64, No. 10, Oct. 2017.
Chun-Cheng Liu, Mu-Chen Huang, and Yu-Hsuan Tu, "A 12 bit 100 MS/s SAR-Assisted Digital-Slope ADC," IEEE journal of solid-state circuits, vol. 51, No. 12, Dec. 2016.
Lin He, et al., "Self-Dithering Technique for High-Resolution SAR ADC Design," IEEE transactions on circuits and systems—II: express briefs, vol. 62, No. 12, Dec. 2015.

* cited by examiner

*Primary Examiner* — Joseph J Lauture
(74) *Attorney, Agent, or Firm* — Young Basile Hanlon & MacFarlane, P.C.

(57) ABSTRACT

Described are apparatus and methods for successive approximation register (SAR) analog to digital converter (ADC) (SAR ADC) with factoring and background clock calibration. An apparatus includes a SAR ADC configured to, in response to receiving an enable flag based on detection of an acquisition clock with a first logic state sent by a controller, sample and convert a pair of differential input signals using a sampling clock to obtain a defined number of samples in an acquisition clock cycle and a factoring circuit configured to obtain the defined number of samples from the SAR ADC using a capturing clock based on the sampling clock, factor the defined number of samples, and send a factored samples ready flag to the controller.

20 Claims, 13 Drawing Sheets

HIGH RESOLUTION SUCCESSIVE APPROXIMATION REGISTER ANALOG TO DIGITAL CONVERTER WITH FACTORING AND BACKGROUND CLOCK CALIBRATION

TECHNICAL FIELD

This disclosure relates to analog to digital converter circuits. More specifically, this disclosure relates to a successive approximation register analog to digital converter with factoring and background clock calibration.

BACKGROUND

Successive approximation register (SAR) analog to digital converters (ADC) (SAR ADCs) employ binary search techniques for analog to digital conversions. In general, SAR ADCs use a track and hold circuit (consisting of a sampling switch and a hold capacitor) to provide a sample of a differential input to a comparator, where the other input of the comparator is connected to a digital-to-analog converter (DAC) for setting a reference voltage level.

SAR ADCs are widely used in fully integrated real time signal monitoring such as with temperature, biomedical, and wireless sensors. The output data from the SAR ADCs are used by controllers, for example, to configure or control operation of the temperature, biomedical, and wireless sensors. The SAR ADC is attractive because it achieves medium to high resolution (8-16 bits) with ultra-low power consumption, low circuit complexity, and highly digital implementations. Asynchronous type SAR ADCs are increasingly used in many applications because they allow coverage of a wide range of sampling frequencies.

Despite these advantages, the noise of comparator and mismatch of DAC's capacitors results in bandwidth harmonics and limits the target effective number of bits (ENOB) of the SAR ADC. These constraints also increase the integral nonlinearity (INL) and differential nonlinearity (DNL). In order to mitigate the aforementioned issues, various approaches such as on-chip and off-chip calibration of the comparator and DAC have been proposed. For example, a conventional SAR ADC may achieve high resolution (ENOB>10 bits) based on trimming of the DAC's capacitor or designing a very complicated on-chip circuit. Alternatively, a post-processing calibration phase is performed in the software environment. Such systems result in extra complexity and limited resolution versus process, supply voltage, and temperature (PVT) variations. Moreover, these systems are power hungry and increase the chip area significantly.

SUMMARY

Described herein are apparatus and methods for a successive approximation register (SAR) analog to digital converter (ADC) (SAR ADC) with factoring and background clock calibration.

In implementations, a circuit includes a successive approximation register (SAR) analog to digital converter (ADC) (SAR ADC) configured to, in response to receiving an enable flag based on detection of an acquisition clock with a first logic state sent by a controller, sample and convert a pair of differential input signals using a sampling clock to obtain a defined number of samples in an acquisition clock cycle and a factoring circuit configured to obtain the defined number of samples from the SAR ADC using a capturing clock based on the sampling clock, factor the defined number of samples, and send a factored samples ready flag to the controller.

In implementations, a device includes a factoring circuit configured to send an enable signal to an asynchronous successive approximation register (SAR) analog to digital converter (ADC) (SAR ADC) in response to detection of a trigger from a controller, send an enabling for factoring signal to the asynchronous SAR ADC after waiting a settling time associated with the asynchronous SAR ADC, and obtain a defined number of samples from the asynchronous SAR ADC within a processing cycle associated with the trigger, the defined number of samples sampled from a pair of differential input signals, and factor the defined number of samples for outputting to the controller.

In implementations, a method includes detecting, by a factoring circuit, a high logic state of an acquisition clock sent from a controller, sending, by a factoring circuit, an enable signal to an asynchronous successive approximation register (SAR) analog to digital converter (ADC) (SAR ADC), obtaining, by the factoring circuit, a defined number of samples of a pair of input differential signal from a monitored device per acquisition clock detection, factoring, by the factoring circuit, the defined number of samples to generate factored data, and sending, by the factoring circuit to the controller, a data ready flag to enable adjusting of monitored device parameters based on the factored data.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
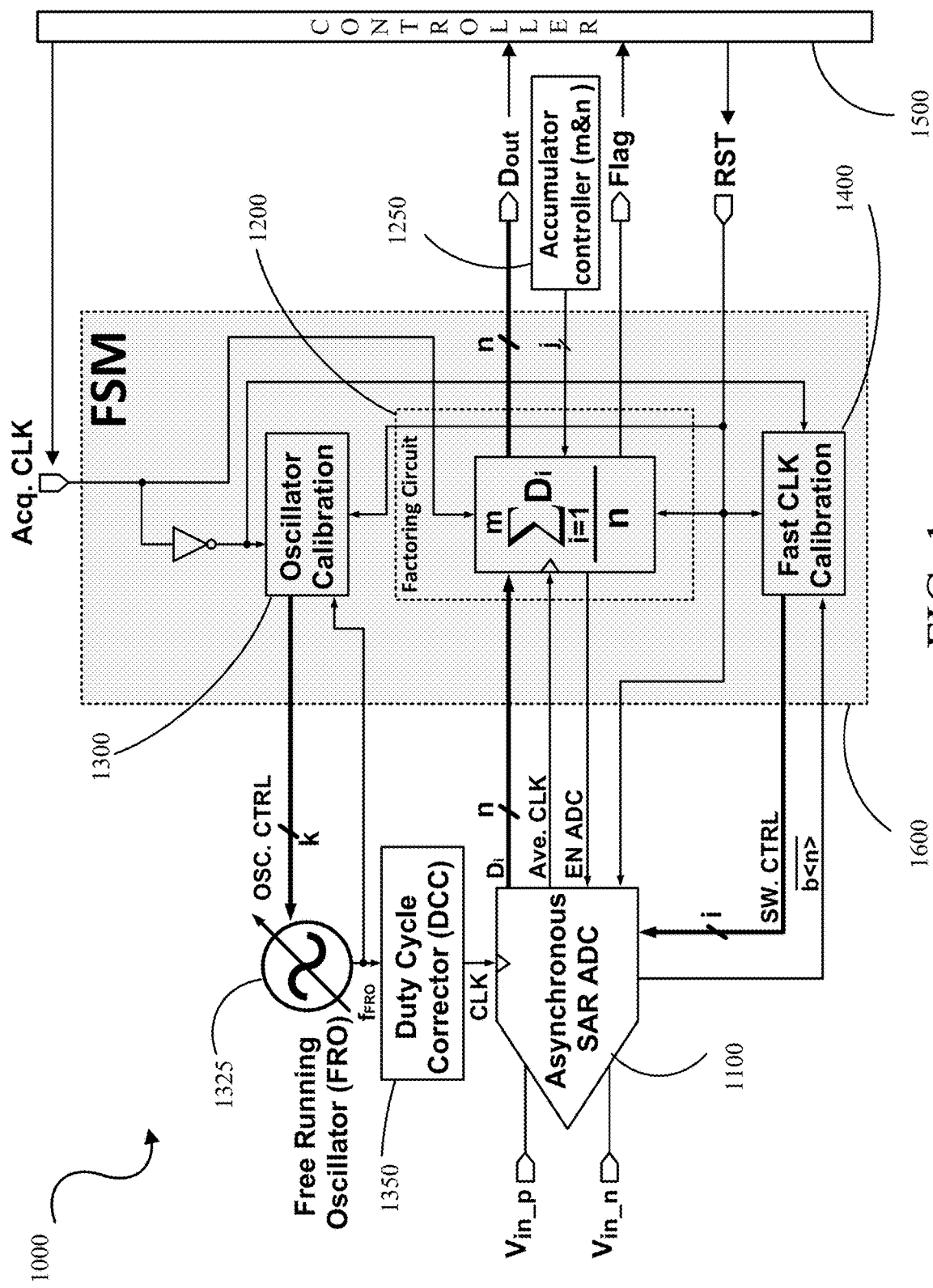
FIG. 1 is a block diagram of an example of a successive approximation register (SAR) analog to digital converter (ADC) (SAR ADC) with a factoring circuit and background clock calibration circuits (collectively "SAR ADC system circuit") in accordance with implementations of this disclosure.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Successive approximation register (SAR) analog to digital converter (ADC) (SAR ADC) use a track and hold circuit (consisting of a sampling switch and a hold capacitor) to provide a sample of a differential input to a comparator, where the other input of the comparator is connected to a digital-to-analog converter (DAC) for setting a reference voltage level. A sampling clock controls operation of the SAR ADC, where a portion of the sampling clock is used for sampling the differential input (the sampling phase) and a portion is used for converting the sampled input bit-by-bit (the conversion phase). An asynchronous fast clock or fast clock, which has a rate greater than that of the sampling clock, can be used during the conversion phase to convert in accordance with the resolution of the SAR ADC. The higher limit of the asynchronous fast clock is set by the settling time of the DAC's capacitor and conversely the lower limit is the worst case of the combination of the following effects: process corners, voltage variations, and temperature variation (PVT). In addition to the noise and non-linearity issues described herein, calibration of the sampling clock and the fast clock is necessary to ensure accurate performance from the SAR ADC.

Described herein are apparatus, devices, circuits, systems, and methods for a SAR ADC system circuit which includes a factoring circuit and background clock calibration circuits. In implementations, multiple conversions of the same input signal are performed in order to average, for example, the quantization noise for better signal to noise and distortion ratio (SNDR) and uncorrelated thermal noise. In implementations, the factoring circuit is configurable to suit application demands such as conversion rate, number of bits, and implementation technology. In implementations, full digital implementation of the factoring circuit does not limit the speed of the SAR ADC.

In implementations, the factoring circuit can be on-chip static data averaging, on-chip static data division, and on-chip static data multiplication. The factoring circuit can be configured or controlled to adjust the ratio between a number of accumulated samples and a division factor to achieve different gain factors at the output which can correspond to averaging, multiplication, or division, instead of using non-ideal components or post-processing in the digital domain.

In implementations, an oscillator calibration circuit is provided which performs background calibration of the free running oscillator (FRO) clock and tuning of the sampling clock in every cycle. The oscillator calibration circuit measures the number of clocks in each period of time and tunes the FRO as needed. For example, tuning of the FRO can generate the sampling clock at a rate sufficient to obtain a defined number of samples for the factoring circuit.

In implementations, a fast clock calibration circuit is provided which performs background calibration of the asynchronous fast clock inside the SAR ADC and provides control of the asynchronous fast clock.

The oscillator calibration circuit and the fast clock calibration circuit provide background oscillator frequency control without the need of a complicated phase locked loop circuit. The fast clock calibration circuit automatically controls the speed of the asynchronous fast clock of the SAR ADC with less sensitivity to the PVT variations. In implementations, full digital implementation of the oscillator calibration circuit and the fast clock calibration circuit do not limit the speed of the SAR ADC.

In implementations, the factoring circuit, the oscillator calibration circuit and the fast clock calibration circuit address non-idealities of SAR ADCs and asynchronous clocks without increasing complexity, while consuming very little power and taking up to 5% of the total chip area. Based on the fully digitally implementation, the novel circuit achieves performance comparable to the state-of-the-art SAR ADCs, without the limitations of analog components imposed by scaled complementary metal-oxide-semiconductor (CMOS) processes. The factoring circuit, the oscillator calibration circuit and the fast clock calibration circuit can be carried over to advanced CMOS technology operating at lower voltage supplies without the need to redesign.

FIG. 1 is a block diagram of an example of a successive approximation register (SAR) analog to digital converter (ADC) (SAR ADC) system circuit 1000 which includes an asynchronous SAR ADC 1100 connected to or in communication with a factoring circuit 1200, a FRO clock calibration circuit 1300, and an asynchronous fast clock calibration circuit 1400 in accordance with implementations of this disclosure. A controller 1500 is connected to the factoring circuit 1200, the FRO clock calibration circuit 1300, and the asynchronous fast clock calibration circuit 1400. A finite state machine (FSM) 1600 defines the behavior and controls the operation of the SAR ADC system circuit 1000 via digital logic circuits and the like.

The FRO clock calibration circuit 1300 is connected to FRO 1325 in a feedback loop. The FRO 1325 is further connected to a duty cycle corrector (DCC) 1350, which in turn is connected to the asynchronous SAR ADC 1100. The asynchronous fast clock calibration circuit 1400 is connected to the asynchronous SAR ADC 1100 in a feedback loop. The factoring circuit 1200 is connected to an accumulator controller 1250, which can configure the factoring circuit 1200 for averaging, multiplication, and division by setting a value for j which is based on a number of samples (m) of a differential input signal and a division factor (n). For example, averaging, multiplication, and division can be expressed as:

$$\frac{\sum_{i=1}^{m} D_i}{n}, \quad m = n \quad \text{(Averaging)}$$

$$\frac{\sum_{i=1}^{m} D_i}{n}, \quad m > n \quad \text{(Multiplier)}$$

$$\frac{\sum_{i=1}^{m} D_i}{n}, \quad m < n \quad \text{(Divider)}$$

Figure 2:
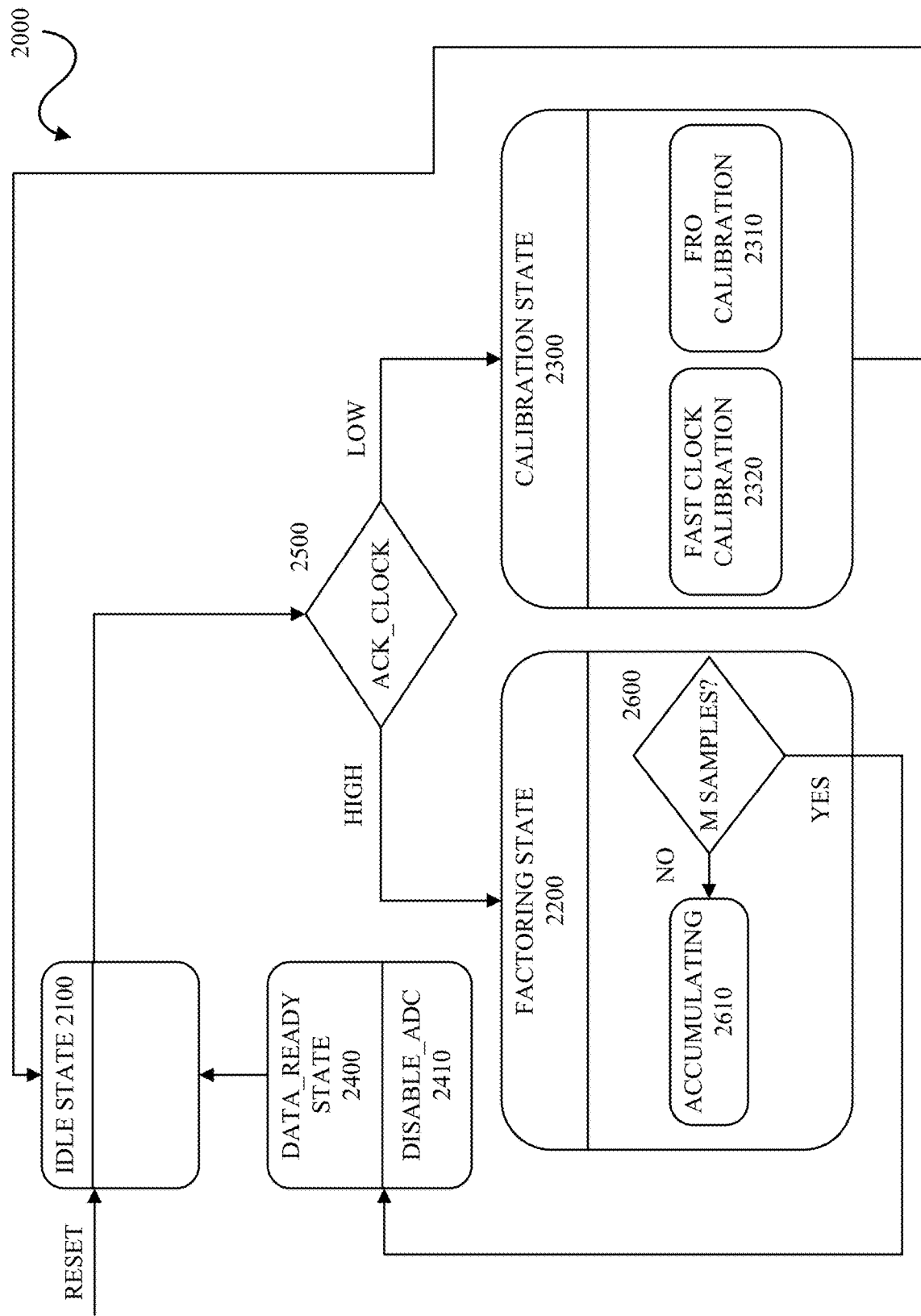
FIG. 2 is a block diagram of an example of a finite state machine for the SAR ADC system circuit of FIG. 1 in accordance with implementations of this disclosure.

FIG. 2 is a block diagram of an example of the FSM 1000 in accordance with implementations of this disclosure. The FSM 1000 can include and move between four states, an idle state 2100, a factoring state 2200, a calibration state 2300, and a data_ready state 2400. Referring now also to FIG. 1, entry into the idle state 2100 can be based on the sending of a reset signal (RST) by the controller 1500, sending of a data ready flag by the factoring circuit 1200, or a completion signal from the FRO calibration circuit 1300 and a completion signal from the asynchronous fast clock calibration circuit 1400, or combinations thereof. The description herein uses a high logic state and a low logic state for certain control signals, flags, and the like. The polarity of the logic states used are illustrative and alternate logic states can be used without departing from the scope of the claims and the specification.

Movement from the idle state 2100 to one of the factoring state 2200 or the calibration state 2300 is predicated on the sending of an acquisition clock or trigger pulse (ACQ_CLK) by the controller 1500 (2500). When the ACQ_CLK has a voltage level representing a high logic state, this triggers movement from the idle state 2100 to the factoring state 2200. In the factoring state 2100, the factoring circuit 1200 enables the asynchronous SAR ADC 1100 to start the sampling and converting of a differential input signal for the defined number of samples. After a settling period, the sampled data are accumulated (2610) and factored in the factoring state 2200. When the defined number of samples have been accumulated and factored (2600), a disable signal (2410) is sent to the asynchronous SAR ADC 1100 (DISABLE_ADC) to stop and conserve power. This moves the FSM 1000 from the factoring state 2100 to the data_ready state 2400, which in turn moves to the idle state 2100 when the factored data (output data) is sent to the controller 1500.

When the ACQ_CLK has a voltage level representing a low logic state, this triggers movement from the idle state 2100 to the calibration state 2300. In the calibration state 2300, the FRO calibration circuit 1300 proceeds to calibrate the FRO 1325 by counting the number of clock pulses (FRO_CLK) at the current FRO frequency and comparing that number against a defined threshold (2310). In implementations, the defined threshold is based on the defined number of samples of the differential input signal needed for the factoring circuit 1200. If the number of clock pulses exceeds the threshold or is sufficient to obtain the defined number of samples then the FRO calibration is complete.

Figure 8:
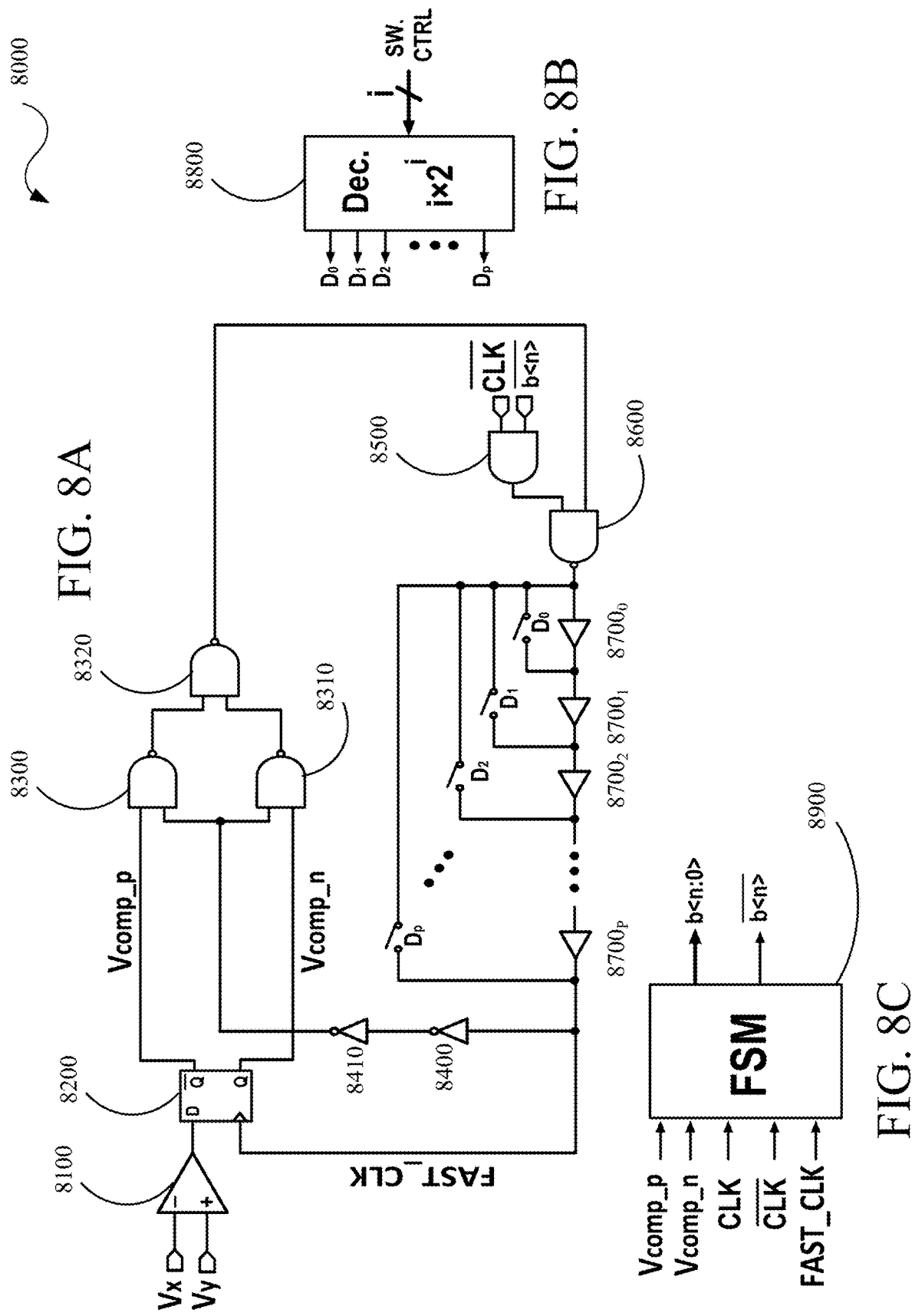
FIG. 8A is a block diagram of an example of an asynchronous clock generator with calibration switches in the SAR ADC system circuit of FIG. 1 in accordance with implementations of this disclosure.
FIG. 8B is a block diagram of an example of a decoder circuit for use with the clock generator of FIG. 8A in accordance with implementations of this disclosure.
FIG. 8C is a block diagram of an example of a FSM for use with the asynchronous SAR ADC of FIG. 8A and the decoder circuit of FIG. 8B in accordance with implementations of this disclosure.

In the calibration state 2300, the asynchronous fast clock calibration circuit 1400 proceeds to calibrate an asynchronous fast clock generator (as shown in FIG. 8) in the asynchronous SAR ADC 1100 (2320). The asynchronous fast clock calibration circuit 1400 sends switching control signals to the asynchronous fast clock generator in response to receiving a last bit signal from the asynchronous fast clock generator indicating whether a last bit in a SAR ADC S bit device has been resolved within the conversion phase of the sampling clock. If the last bit signal signals that the last bit was resolved, then the asynchronous fast clock calibration is complete. The FSM 1000 moves from the calibration state 2300 to the idle state 2100 when completion signals are received from both the FRO calibration circuit 1300 and the asynchronous fast clock calibration circuit 1400.

The FRO calibration process and the asynchronous fast clock calibration process continuously run in the background when data is not being sampled and factored. This leads to power savings and improved accuracy as the respective clocks are fine tuned to generate just enough clocks or operate at a frequency sufficient to obtain the m samples and convert each of the bits in each of the m samples.

Figure 3:
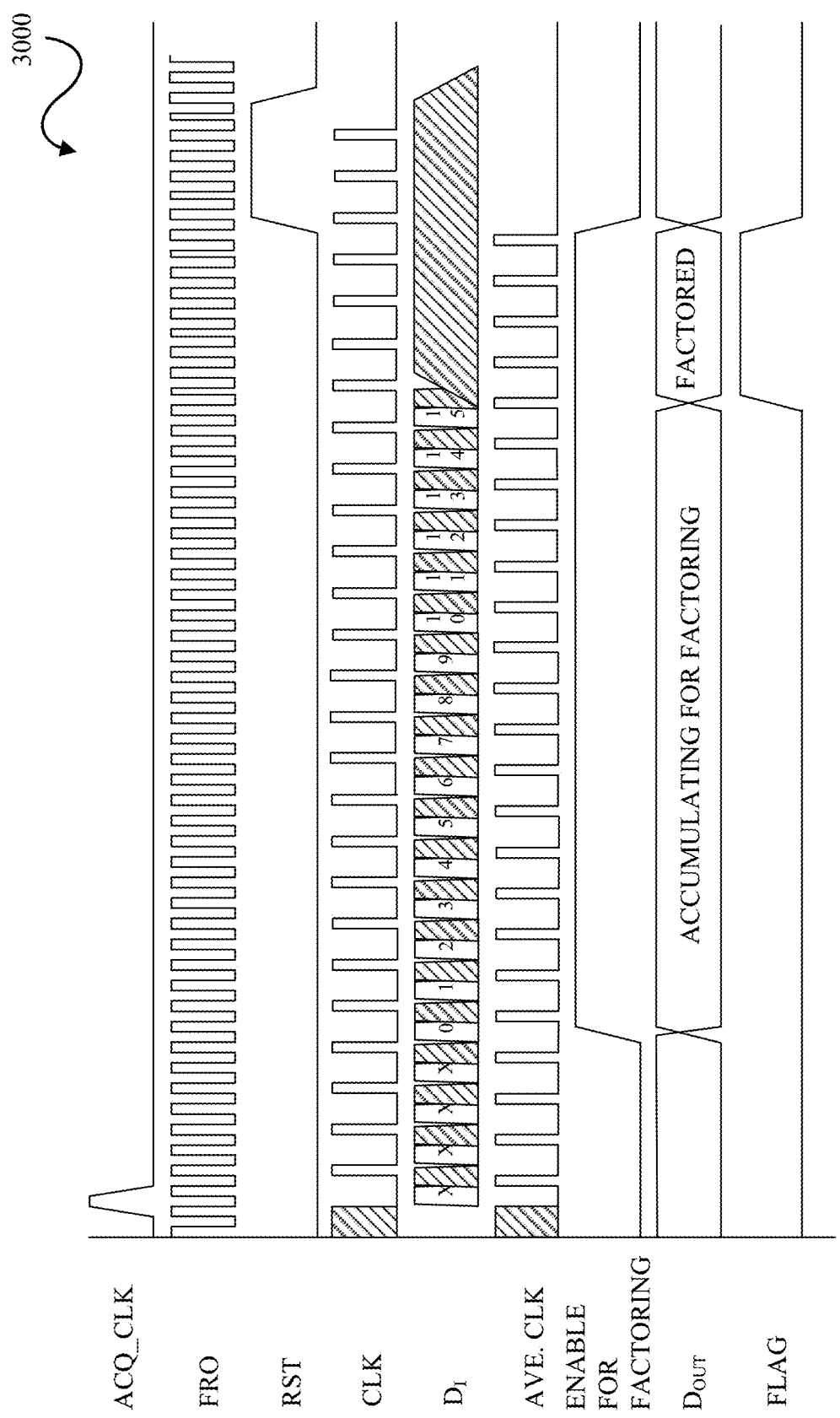
FIG. 3 is a diagram of an example of a timing diagram for the SAR ADC system circuit of FIG. 1 in accordance with implementations of this disclosure.

Operation of the SAR ADC system circuit 1000 is described with reference to FIG. 2 and FIG. 3, where FIG. 3 is a diagram of an example of a timing diagram 3000 for the SAR ADC system circuit 1000 in accordance with implementations of this disclosure. The timing diagram 3000 includes a trigger signal (ACK_CLK) which is sent by the controller 1500 to initiate the process cycle, a FRO clock (FRO) which is calibrated based on a number of samples needed for the factoring circuit 1200, a reset signal (RST) which is sent by the controller 1500 to initialize the system for the next process cycle, a sampling clock (CLK) based on the FRO sent by the DCC 1350 to the SAR ADC 1100, input data ($D_{IN}$) from the SAR ADC 1100 to the factoring circuit 1200, an averaging clock (AVE. CLK) sent by the SAR ADC 1100 to the factoring circuit 1200 to use for obtaining or capturing the input data $D_{IN}$, an enable for averaging clock (ENABLE FOR AVERAGING) sent by the factoring circuit 1200 to the SAR ADC 1100 to account for a settling time of the SAR ADC 1100, data output ($D_{OUT}$) ready for sending by the factoring circuit 1200 to the controller 1500, and a data ready flag (FLAG) sent by the factoring circuit 1200 to the controller 1500 to obtain $D_{OUT}$.

The factoring circuit 1200 is configured to factor based on a configuration set by the accumulator controller 1250. The accumulator controller 1250 defines the number of samples (m) to be completed for one ACQ_CLK trigger or processing cycle and a division ratio (n). This control process can be performed by a bus with J bits where half of the bits are dedicated for m and the rest are for n. The factoring can include averaging, multiplication, division, and the like.

The FRO 1325 is calibrated, when the ACQ_CLK is in a low logic state, to generate a FRO clock frequency ($f_{FRO}$) sufficient to generate or obtain the m samples. The FRO calibration circuit 1300 sends a k bit oscillator control signal (OSC. CTRL) to the FRO 1325 which determines how many capacitors, for example, are disconnected or connected to generate the appropriate FRO clock frequency. The OSC. CTRL is set by counting the number of clock cycles or pulses in the FRO clock frequency and comparing it against a defined threshold based on the number of samples.

The asynchronous fast clock generator (as shown in FIG. 8) is calibrated to generate a clock frequency sufficient to complete S conversions for each of the m samples. The asynchronous fast clock calibration circuit 1400 sends an i bit switch control signal (SW. CTRL) to the asynchronous fast clock generator (as shown in FIG. 8) in the asynchronous SAR ADC 1100. The SW. CTRL controls how many buffer circuits are disconnected or connected to generate the appropriate asynchronous fast clock frequency. The SW. CTRL is set by the asynchronous fast clock calibration circuit 1400 based on whether a last bit signal (complementary b<n>) indicates that a last bit in a SAR ADC S bit device has been resolved.

The controller 1500 sends the ACQ_CLK with a voltage representing a high logic state. The factoring circuit 1200 detects the high logic state of the ACQ_CLK and sends an enable signal (EN_ADC) to the asynchronous SAR ADC 1100. The asynchronous SAR ADC 1100 is a S bit device which samples a pair of differential input signals, $V_{IN\_P}$ and $V_{IN\_N}$, m times using the sampling clock (CLK) provided by the DCC circuit 1350. In implementations, a sampling phase is 25% of the sampling clock cycle. A conversion phase follows the sampling phase to convert the sampled differential input signal. The SAR ADC 1100 sends an averaging or factoring clock (AVE. CLK) to the factoring circuit 1200 for capturing the input data ($D_{IN}$) from the SAR ADC 1100, where the AVE. CLK is based on the CLK.

The factoring circuit 1200 is aware of the settling time associated with the SAR ADC 1100 and sends an enable for averaging signal (ENABLE FOR AVERAGING) to the SAR ADC 1100 after the settling time has elapsed. In implementations, the defined settling time is 4 cycles. In implementations, the ENABLE FOR AVERAGING is set at a high logic state and remains at the high logic state until a reset signal (RST) is sent by the controller 1500 or the output data ($D_{OUT}$) is obtained by the controller 1500. The factoring circuit 1200 accumulates and factors the m samples from the SAR ADC 1100. The factoring circuit 1200 sets a flag (FLAG) to a high logic state when factoring is complete and the output data ($D_{OUT}$) is ready for capture or use by the controller 1500. The controller 1500 can use the output data to adjust gains, bias voltage, and other parameters of a device associated with the input differential signal. The controller 1500 sends a reset signal to prepare or initialize the process for a new differential input signal.

Figure 4:
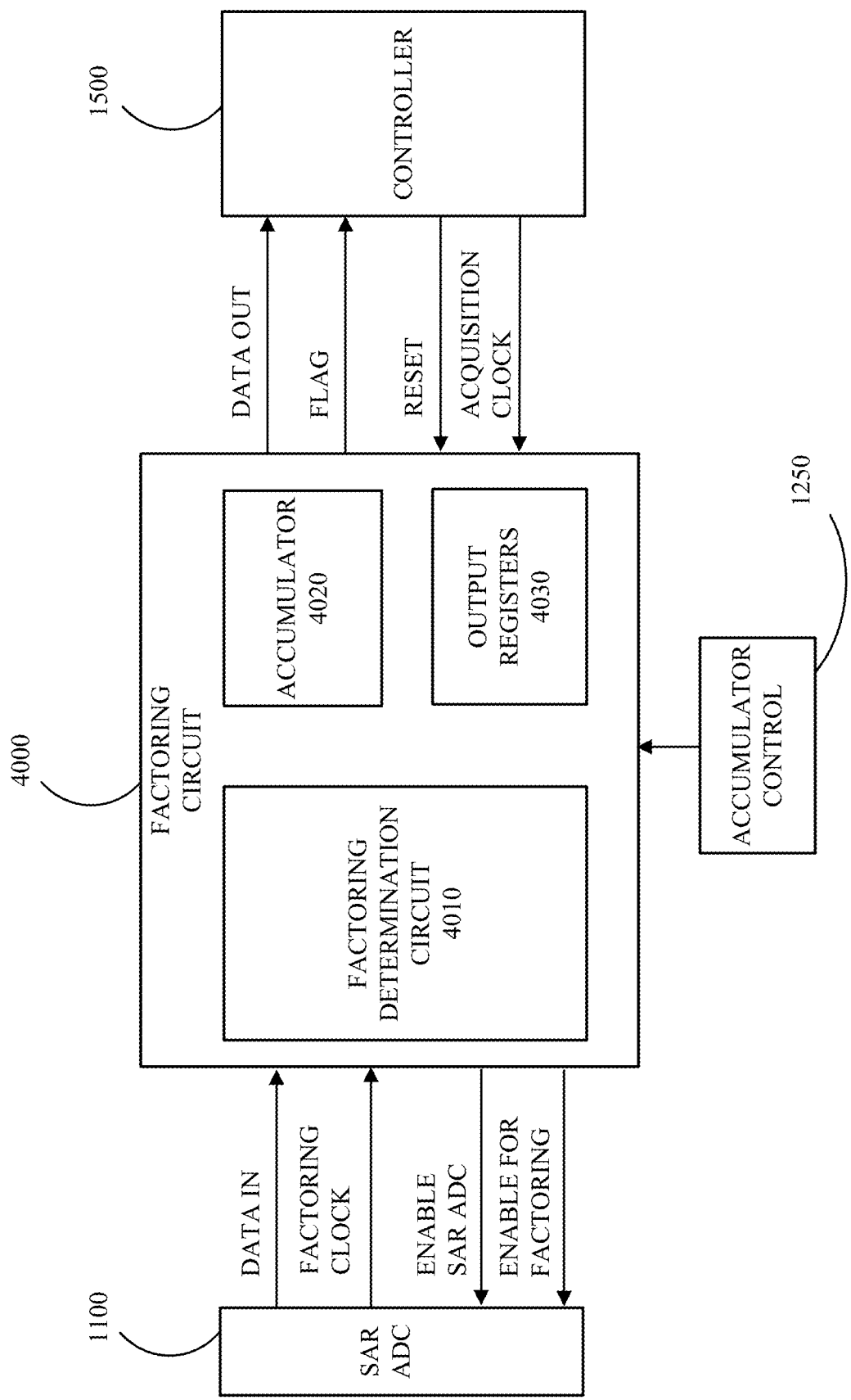
FIG. 4 is a block diagram of an example of a factoring circuit in the SAR ADC system circuit of FIG. 1 in accordance with implementations of this disclosure.

FIG. 4 is a block diagram of an example of a factoring circuit 4000 in the SAR ADC system circuit 1000 of FIG. 1 in accordance with implementations of this disclosure. The SAR ADC system circuit 1000 includes the asynchronous SAR ADC 1100 connected to the factoring circuit 4000, which in turn is connected to the controller 1500 and the accumulator controller 1250. The factoring circuit 4000 includes a factoring determination circuit 4010, an accumulator 4020, and output registers 4030. In implementations, the accumulator 4020 can be a 16 bit accumulator. The asynchronous SAR ADC 1100, the factoring circuit 4000, the accumulator controller 1250, and the controller 1500 function and operate at least as described with respect to FIGS. 1-3 and as described herein.

Operationally, the factoring circuit 4000 detects an acquisition clock having a high logic state and sends an enable signal to the SAR ADC 1100. The factoring circuit 4000 sends an enable for factoring signal to the SAR ADC 1100 after waiting the settling time associated with the SAR ADC 1100. The SAR ADC 1100 sends a factoring clock (same as the AVE. CLK in FIGS. 1 and 3) to the factoring circuit 4000 to capture the input data (DATA IN) from the SAR ADC 1100. The accumulator 4020 begins to accumulate the incoming S bits from the SAR ADC 1100 for a total of m cycles or m sample captures. The factoring determination circuit 4010 operates on the accumulated data in the accumulator 4020. For example, the operation can be averaging, multiplication, division, and the like. The factored data is then stored in the output registers 4030. An output ready flag (FLAG) is set to a high logic state for detection by the controller 1500. The FLAG remains high until a reset signal set to a high logic state is detected. The factored data in the output registers 4030 remains until over-written by new factored data.

Figure 5:
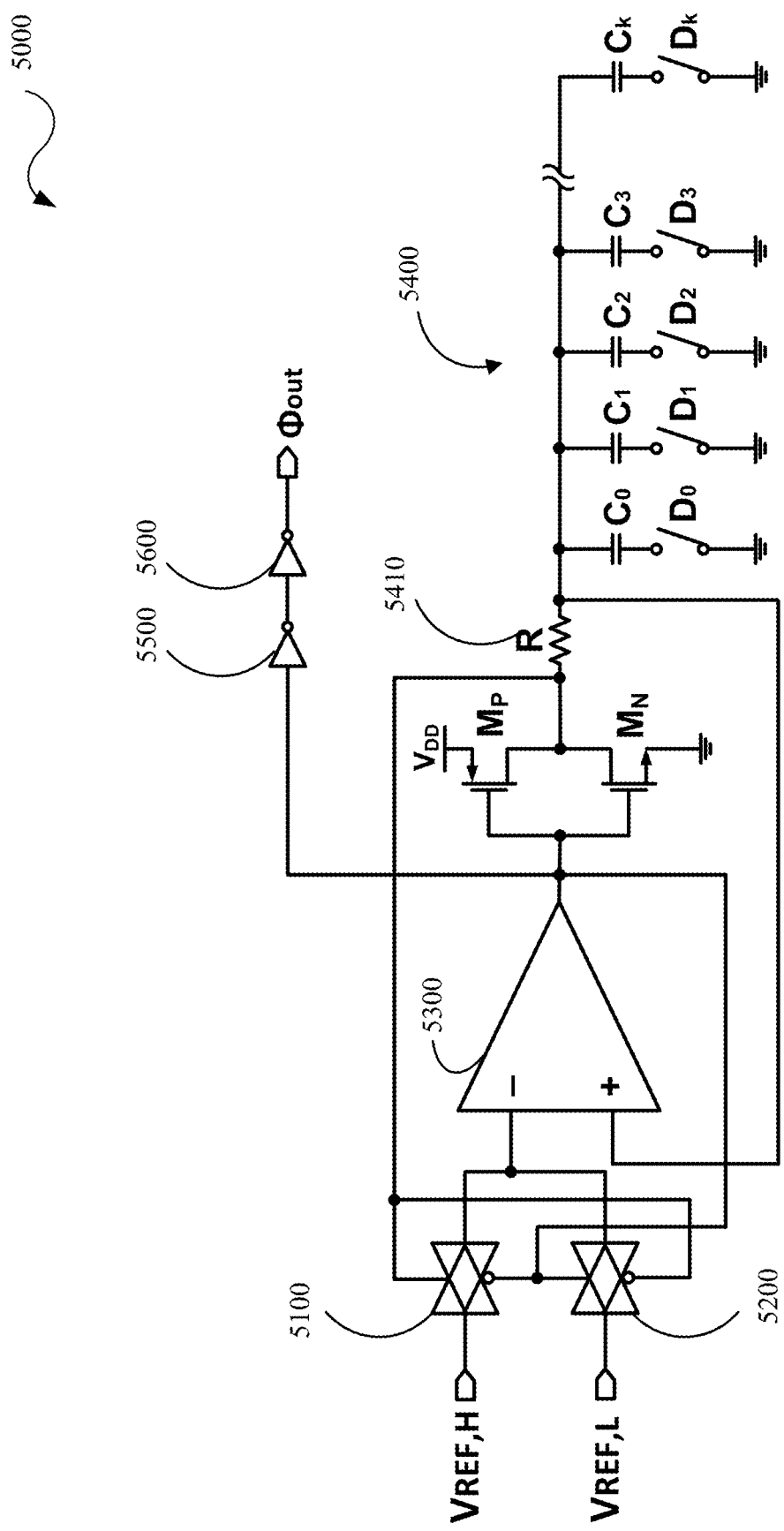
FIG. 5 is a block diagram of an example of a free running oscillator (FRO) for the SAR ADC system circuit of FIG. 1 in accordance with implementations of this disclosure.

FIG. 5 is a block diagram of an example of a free running oscillator (FRO) 5000 for the SAR ADC system circuit 1000 of FIG. 1 in accordance with implementations of this disclosure. In implementations, the FRO 5000 is a tunable relaxation oscillator. The FRO 5000 includes a pair of transmission gates 5100 and 5200 connected together, where one transmission gate 5100 is connected to a high reference voltage ($V_{REF,H}$) and the other transmission gate 5200 is connected to a low reference voltage ($V_{REF,L}$). The pair of transmission gates 5100 and 5200 are further connected to an input of an operational amplifier 5300, which has another input connected to a switchable resistor-capacitor network 5400. The output of the operational amplifier 5300 is connected to gates of a pair of transistors $M_P$ and $M_N$, which have drains connected together and are further connected to the switchable resistor-capacitor network 5400 and to the transmission gate 5100. The transistor $M_P$ has a source connected to supply voltage and the transistor $M_N$ has a source connected to ground. The output of the FRO 5000 is tapped from a connection between the interconnected transmission gates 5100 and 5200 and fed through a pair of inverters 5500 and 5600. The switchable resistor-capacitor network 5400 includes a resistor 5410 connected to a bank of capacitors $C_0$, $C_1$, $C_2$, $C_3$, . . . , $C_k$ which are each connectable to an associated switch $D_0$, $D_1$, $D_2$, $D_3$, . . . , $D_k$, which in turn are connected to ground. The frequency of the FRO 5000 is increased by disconnecting one or more of the bank of capacitors $C_0$, $C_1$, $C_2$, $C_3$, . . . , $C_k$. The connecting or disconnecting of the bank of capacitors $C_0$, $C_1$, $C_2$, $C_3$, . . . , $C_k$ is controlled by the FRO calibration circuit 1300.

Figure 6:
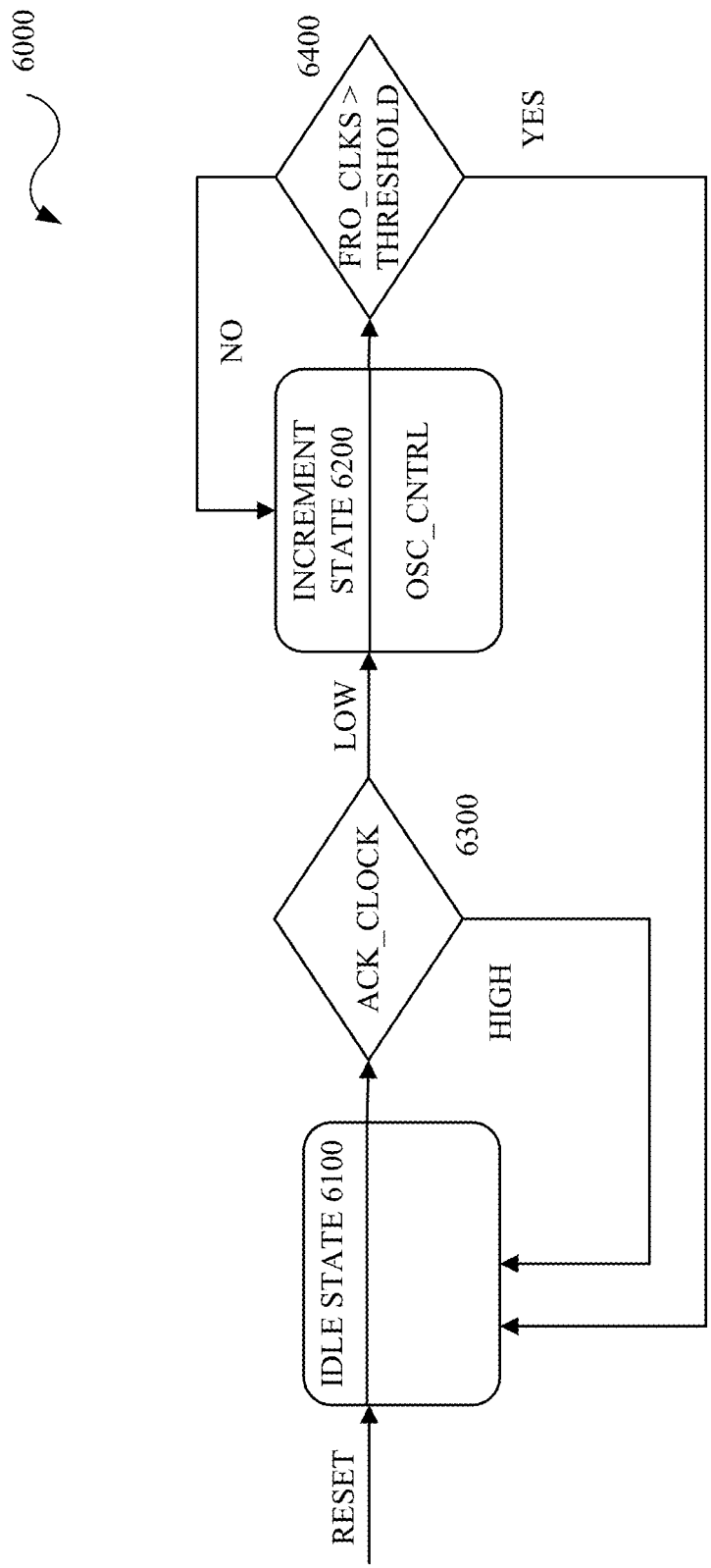
FIG. 6 is a block diagram of an example of a finite state machine for a calibration circuit for the FRO of FIG. 5 and the SAR ADC system circuit of FIG. 1 in accordance with implementations of this disclosure.

FIG. 6 is a block diagram of an example of an FSM 6000 for the FRO calibration circuit 1300 of FIG. 1 in accordance with implementations of this disclosure. The FSM 6000 can include and move between two states, an idle state 6100 and an increment state 6200. Referring now also to FIGS. 1-5 as appropriate, entry into the idle state 6100 can be based on the sending of a reset signal (RST) by the controller 1500, sending of a ACK_CLK signal in a high logic state by the controller 1500, a completion signal from the FRO calibration circuit 1300, or combinations thereof. The FRO calibration process is independent of the ACQ CLK pulse width which greatly improves the usability of the circuit in different applications.

Movement from the idle state 6100 to the increment state 6200 or remaining in the idle state 6100 is predicated on the sending of the ACQ_CLK by the controller 1500 (6300). When the ACQ_CLK has a voltage level representing a low logic state, this triggers movement from the idle state 6100 to the increment state 6200. In the increment state 6200, the FRO calibration circuit 1300 increments a frequency of the FRO 5000 when the number of clocks counted does not at least meet a defined threshold, where the defined threshold is based on the number of samples needed from a differential input upon detection of the ACQ_CLK in a high logic state prior to detection of a next ACQ_CLK in a high logic state. The FRO calibration circuit 1300 increments or sets bit(s) of a k bit oscillator control (OSC_CNTRL) when the number of clocks counted does not at least meet the defined threshold. The number of clocks is counted at the new frequency. If the number of clocks counted does not at least meet the defined threshold (6400), the FRO calibration circuit 1300 again increments the k bit oscillator control. If the number of clocks counted at least meets the defined threshold, the FSM 6000 moves from the increment state 6200 to the idle state 6100. When the ACQ_CLK has a voltage level representing a high logic state, the FSM 6000 returns to or remains in the idle state 6100.

Figure 7:
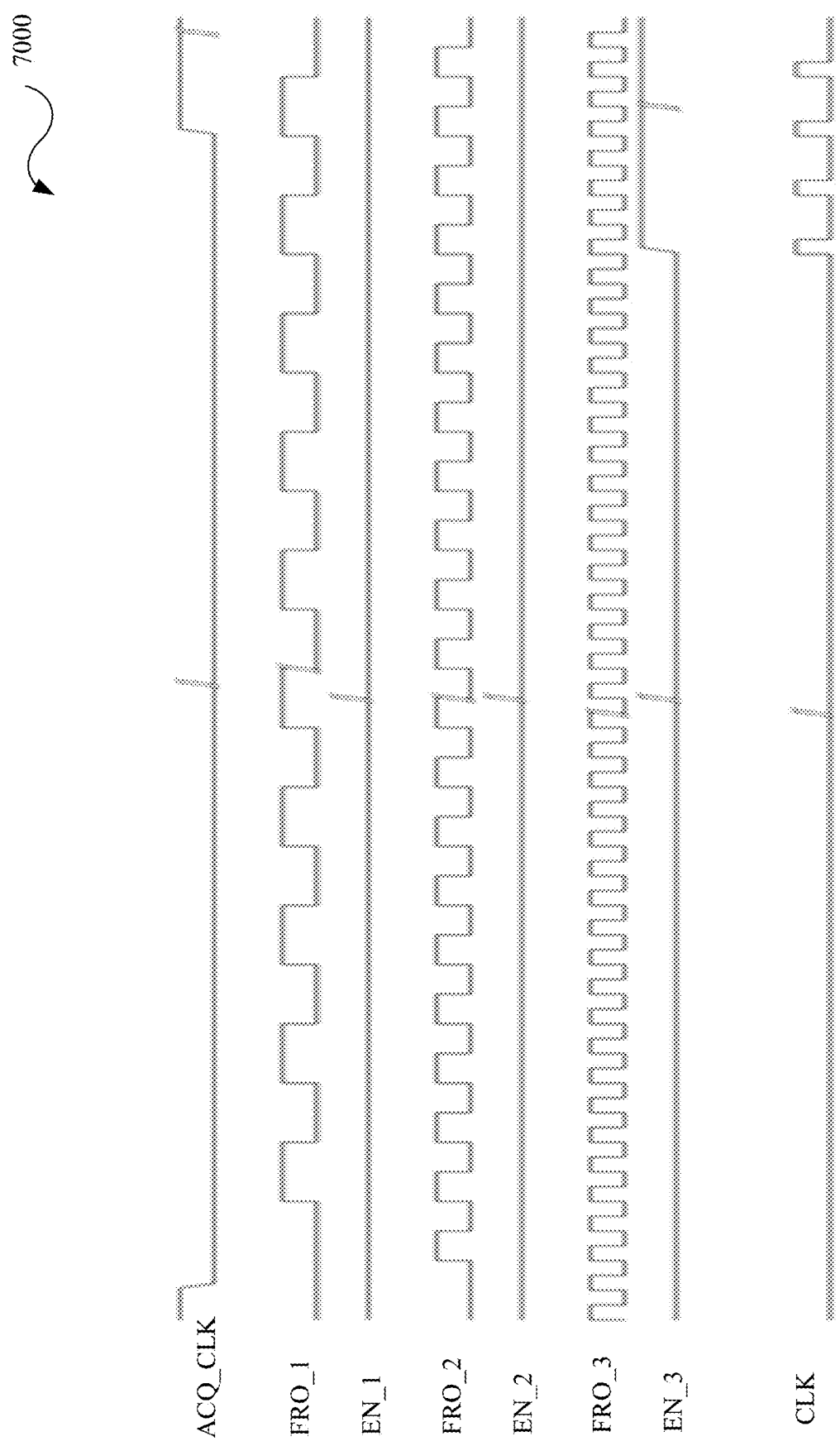
FIG. 7 is a diagram of an example of a timing diagram for the FRO of FIG. 5 and the SAR ADC system circuit of FIG. 1 in accordance with implementations of this disclosure.

Operation of the FRO 5000 and the FRO calibration circuit 1300 is described with reference to FIGS. 1-7, where FIG. 7 is a diagram of an example of a timing diagram 7000 for the FRO 5000 and the FRO calibration circuit 1300 in accordance with implementations of this disclosure. The timing diagram 7000 includes a trigger signal (ACK_CLK) which is sent by the controller 1500 to initiate the process cycle, a first FRO frequency (FRO_1) of the FRO 5000, a first enable signal (EN_1), a second FRO frequency (FRO_2) of the FRO 5000, a second enable signal (EN_2), a third FRO frequency (FRO_3) of the FRO 5000, a third enable signal (EN_3), and a sampling clock (CLK) generated by the DCC 1350 based on the FRO frequency. The number of intermediate FRO frequencies, FRO_1 and FRO_2, are solely illustrative of the FRO calibration process.

As described herein, the FRO calibration process is triggered when the ACK_CLK is at a low logic state. At the falling edge of the ACQ CLK, the FRO 5000 starts to oscillate at its initial frequency (FRO_1). The FRO calibration circuit 1300 senses or counts the number of clocks in the calibration mode (i.e., during the ACQ CLK low logic state) and sets an enable once the number of clocks or clock pulses is sufficient to perform m samples. For example, if m is 16, then 50 clocks are required to perform 16 times analog to digital conversion and factoring. As shown, FRO_1 is not a sufficiently high enough frequency so the associated enable signal EN_1 remains in a low logic state. If the number of clocks is not sufficiently high enough, the FRO calibration circuit 1300 increases the speed of the FRO 5000 by disconnecting one or more capacitors $C_0, C_1, C_2, C_3, \ldots, C_k$. The number of clocks is counted and checked again. As shown, FRO_2 is not a sufficiently high enough frequency so the associated enable signal EN_2 remains in a low logic state. The FRO calibration circuit 1300 increases the speed of the FRO 5000. The number of clocks is counted and checked again. As shown, the FRO_3 is a sufficiently high enough frequency so the associated enable signal EN_3 is set to a high logic state. The DCC 1350 then generates the CLK based on FRO_3.

FIG. 8A is a block diagram of an example of an asynchronous clock generator or fast clock generator 8000 with calibration switches in the SAR ADC system circuit 1000 of FIG. 1 in accordance with implementations of this disclosure. The asynchronous clock generator 8000 includes an operational amplifier 8100 connected to a D input of a D flip-flop 8200. The operational amplifier 8100 has inputs connected to a differential input ($V_X$ and $V_Y$). A clock input of the D flip-flop 8200 is connected to the fast clock (FAST_CLK). A first output ($V_{COMP\_P}$) of the D flip-flop 8200 is connected to one input of a NAND gate 8300 and a second output ($V_{COMP\_N}$) of the D flip-flop 8200 is connected to one input of a NAND gate 8310, the remaining inputs of the NAND gates 8300 and 8310 are connected together and are connected to a delayed FAST_CLK via a pair of inverters 8400 and 8410. The output of the NAND gate 8300 is connected to an input of a NAND gate 8320 and the output of the NAND gate 8310 is connected to the remaining input of the NAND gate 8320.

The asynchronous clock generator 8000 includes an AND gate 8500 with an input connected to a complementary CLK and a remaining input connected to a complementary last bit flag (complementary b<n>). The output of the AND gate 8500 is connected to an input of a NAND gate 8600 and a remaining input is connected to the output of the NAND gate 8320. The output of the NAND gate 8600 is connected to a bank of switchable delay gates $8700_0, 8700_1, 8700_2, \ldots, 8700_P$ acting as buffers. Each of the bank of switchable delay gates $8700_0, 8700_1, 8700_2, \ldots, 8700_P$ is associated with a switch $D_0, D_1, D_2, D_3, \ldots, D_k$, which in turn are connected to the output of the NAND gate 8600. Each of the switches $D_0, D_1, D_2, D_3, \ldots, D_k$ is connected to a corresponding output of a decoder circuit 8800 as shown in FIG. 8B. The decoder circuit 8800 is connected to the asynchronous fast clock calibration circuit 1400 and receives the i switch control bits (SW. CTRL) for controlling the switches $D_0, D_1, D_2, D_3, \ldots, D_k$.

FIG. 8C is a block diagram of an example of an FSM 8900 for use with the asynchronous clock generator 8000 of FIG. 8A and the decoder circuit 8800 of FIG. 8B in accordance with implementations of this disclosure. The inputs to the FSM 8900 include the $V_{COMP\_P}$, $V_{COMP\_N}$, the CLK, the complement CLK, and the FAST_CLK. The FSM 8900 outputs the complementary last bit flag (complementary b<n>) and a bit flag (b<n:0>) for each bit.

Figure 9:
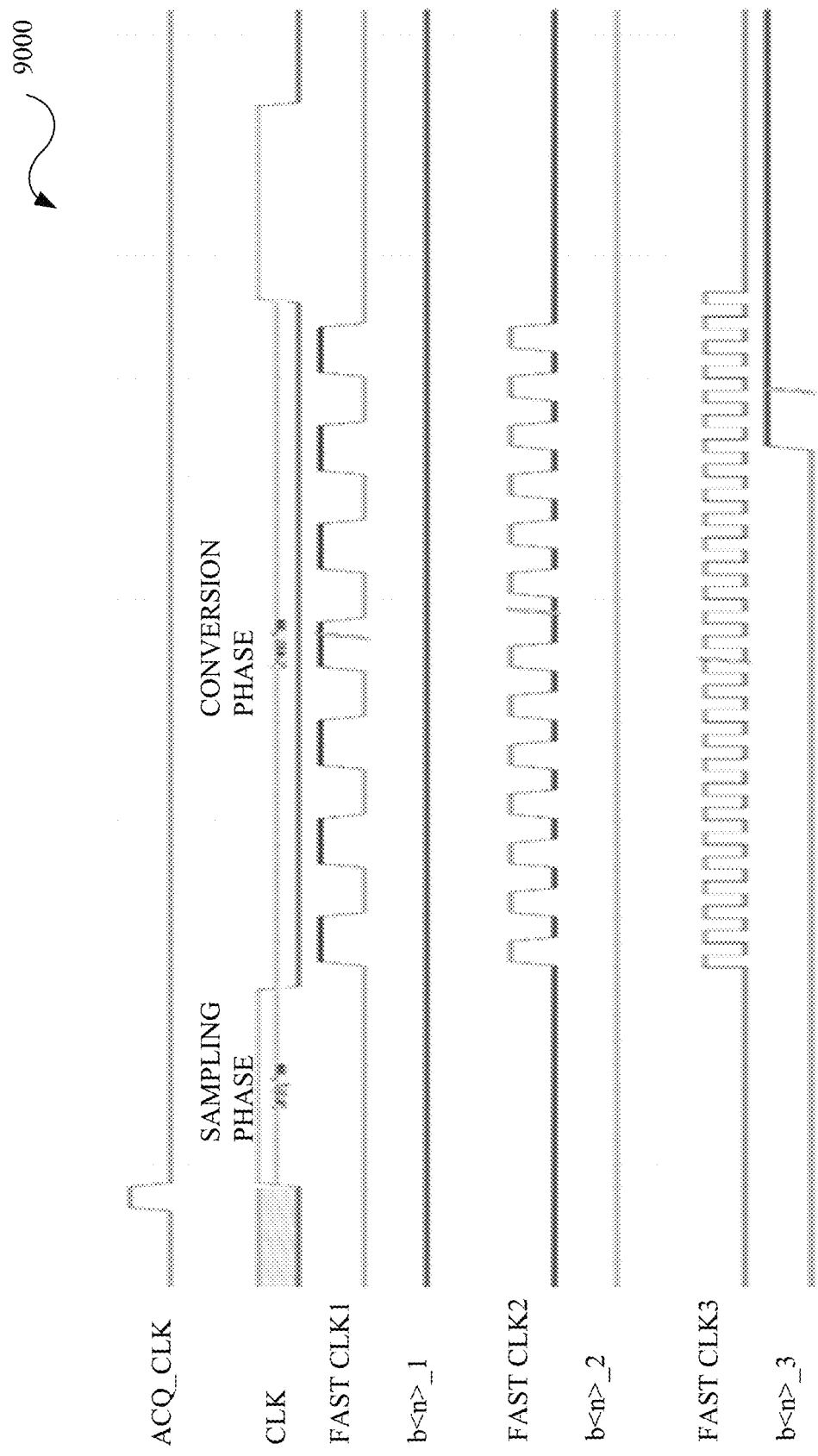
FIG. 9 is a diagram of an example of a timing diagram for the asynchronous clock generator with calibration switches of FIG. 8 and the SAR ADC system circuit of FIG. 8 in accordance with implementations of this disclosure.

Operation of the asynchronous clock generator 8000 and the asynchronous fast clock calibration circuit 1400 is described with reference to FIGS. 1-9, where FIG. 9 is a diagram of an example of a timing diagram 9000 for the asynchronous clock generator 8000 and the asynchronous fast clock calibration circuit 1400 in accordance with implementations of this disclosure. The timing diagram 9000 includes a trigger signal (ACK_CLK) which is sent by the controller 1500 to initiate the process cycle, a sampling clock (CLK), a first fast clock frequency (FAST CLK1) of the asynchronous clock generator 8000, a last bit flag (b<n>) for the FAST CLK1, a second fast clock frequency (FAST CLK2) of the asynchronous clock generator 8000, a last bit flag (b<n>) for the FAST CLK2, a third fast clock frequency (FAST CLK3) of the asynchronous clock generator 8000, and a last bit flag (b<n>) for the FAST CLK3. The number of intermediate asynchronous clock generator 8000 frequencies, FAST CLK1 and FAST CLK2, are solely illustrative of the FRO calibration process.

As described herein, the asynchronous fast clock calibration process is triggered when the ACK_CLK is at a low logic state. The asynchronous fast clock calibration process is independent of the ACQ CLK pulse width which greatly improves the usability of the circuit in different applications. The frequency and duty cycle of the asynchronous clock can change during the calibration process but remains within the frequency range of the SAR ADC and this presents or produces no issues to the SAR ADC. As shown, the asynchronous clock starts to oscillate at a lower range of the frequency during the conversion phase. The asynchronous fast clock calibration circuit 1400 monitors the conversion of the last bit (i.e. b<n>). If the last bit flag is set to a low logic state, the asynchronous fast clock calibration circuit 1400 increases the frequency by setting one or more bits in the SW. CTRL. As shown, the frequency for FAST CLK1 is not sufficiently high enough, and the corresponding b<n>_1 remains in a low logic state. Since the last bit flag remains in the low logic state, the asynchronous fast clock calibration circuit 1400 sets one or more bits in the SW. CTRL. The asynchronous fast clock calibration circuit 1400 continues to monitor the conversion of the last bit (i.e. b<n>). As shown, the frequency for FAST CLK2 is not sufficiently high enough, and the corresponding b<n>_2 remains in a low logic state. Since the last bit flag remains in the low logic state, the asynchronous fast clock calibration circuit 1400 sets one or more bits in the SW. CTRL. The asynchronous fast clock calibration circuit 1400 continues to monitor the conversion of the last bit (i.e. b<n>). As shown, the frequency for FAST CLK3 is sufficiently high enough, and the corresponding b<n>_3 is now in a high logic state. The asynchronous fast clock calibration is now complete and stops.

Figure 10:
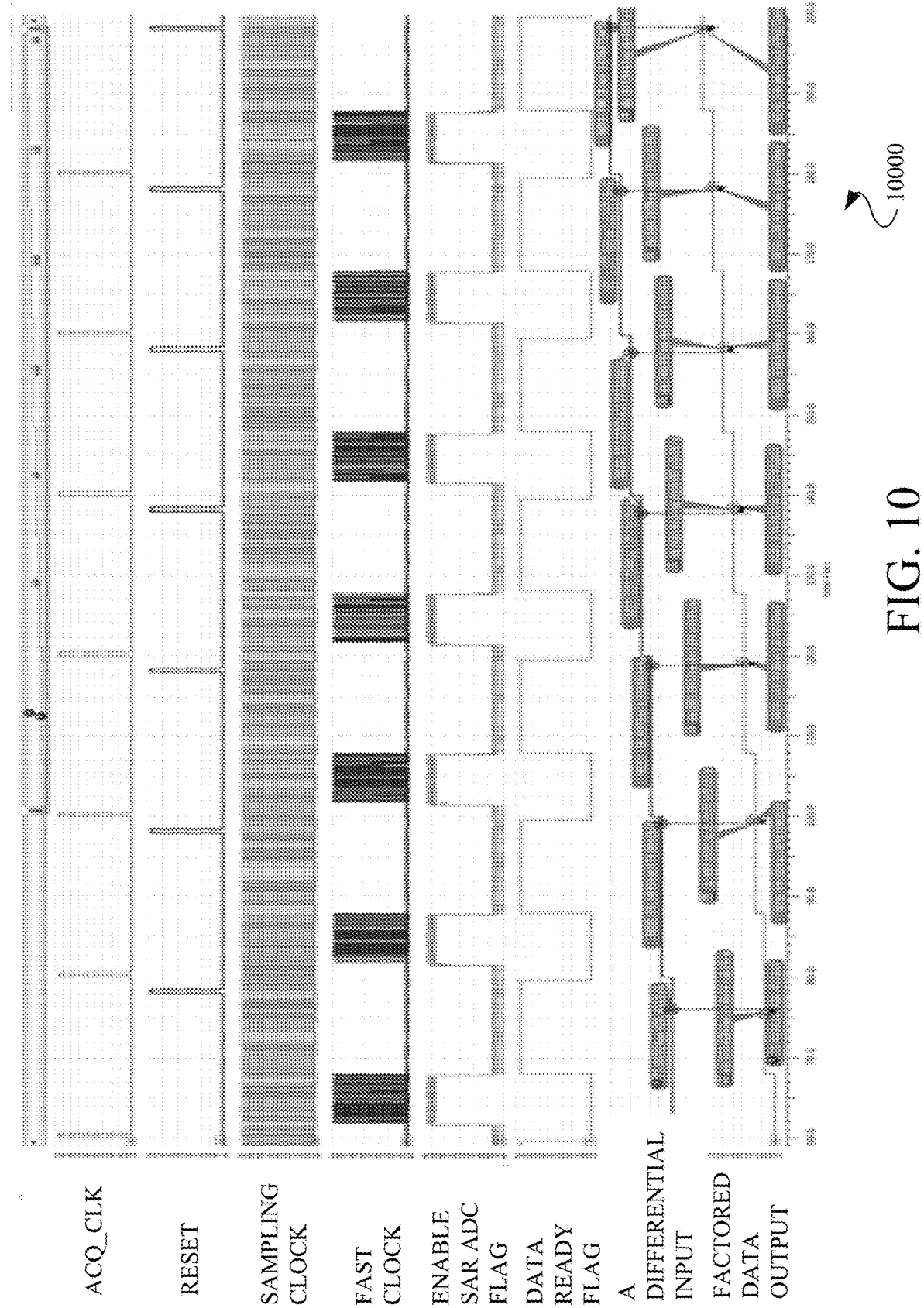
FIG. 10 is a graph of an example timing diagram simulation for the SAR ADC system circuit of FIG. 1 in accordance with implementations of this disclosure.

FIG. 10 is a graph of an example timing diagram 10000 based on a simulation of the SAR ADC system circuit of FIG. 1 in accordance with implementations of this disclosure. The timing diagram 10000 includes the ACK_CLK, the reset, the sampling clock, the fast clock, the enable SAR ADC flag, the data ready flag, one of the differential inputs, and the factored data output. The input differential voltages are set to three different voltages (1.0 V, 0.5 V, and 1.5 V). As shown, the output tracks the input signal accurately with an error of less than ±LSB/4.

Figure 11B:
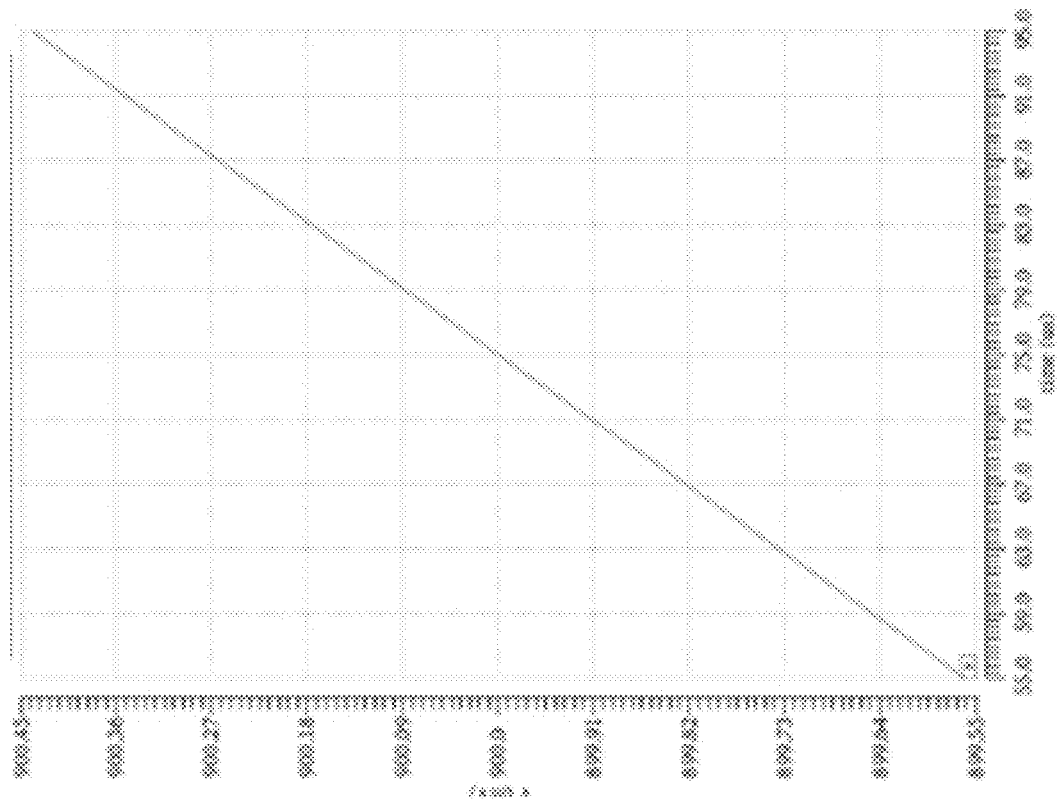
FIGS. 11A, 11B, and 11C are graphs of example transfer curves and a linearity error for simulated process, voltage, and temperature variations for the SAR ADC system circuit of FIG. 1 in accordance with implementations of this disclosure.
Figure 11A:
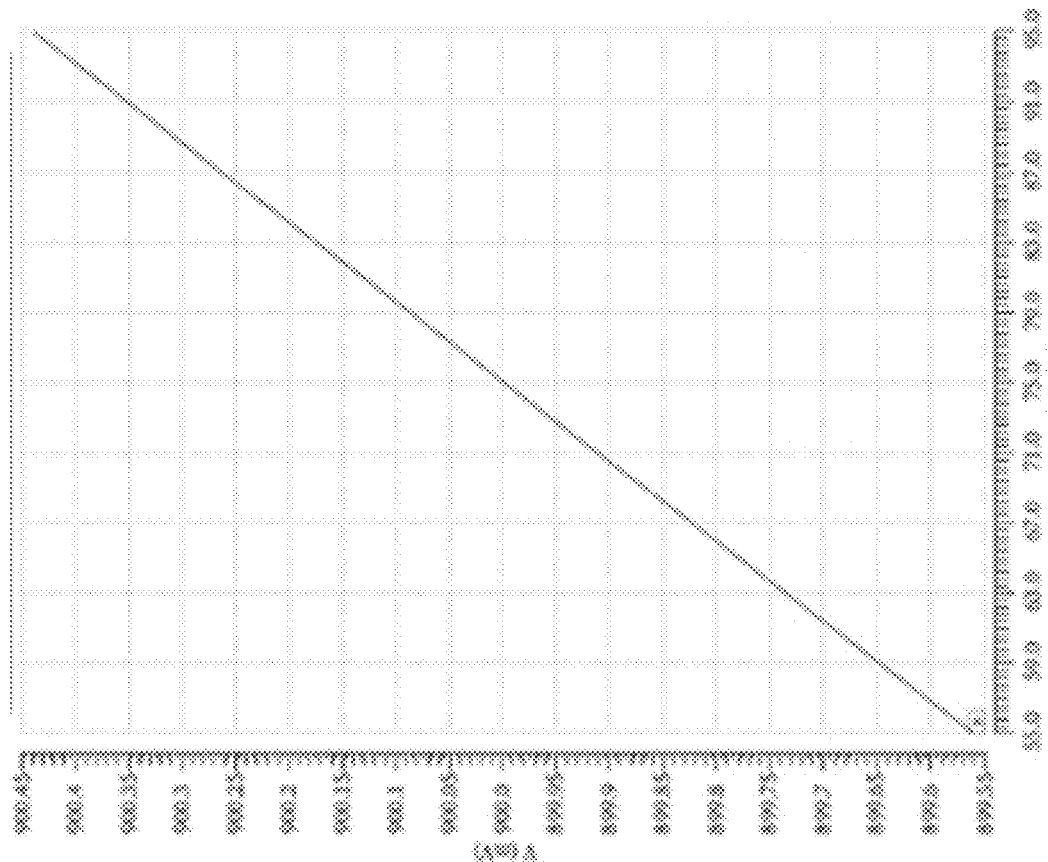
Figure 11C:
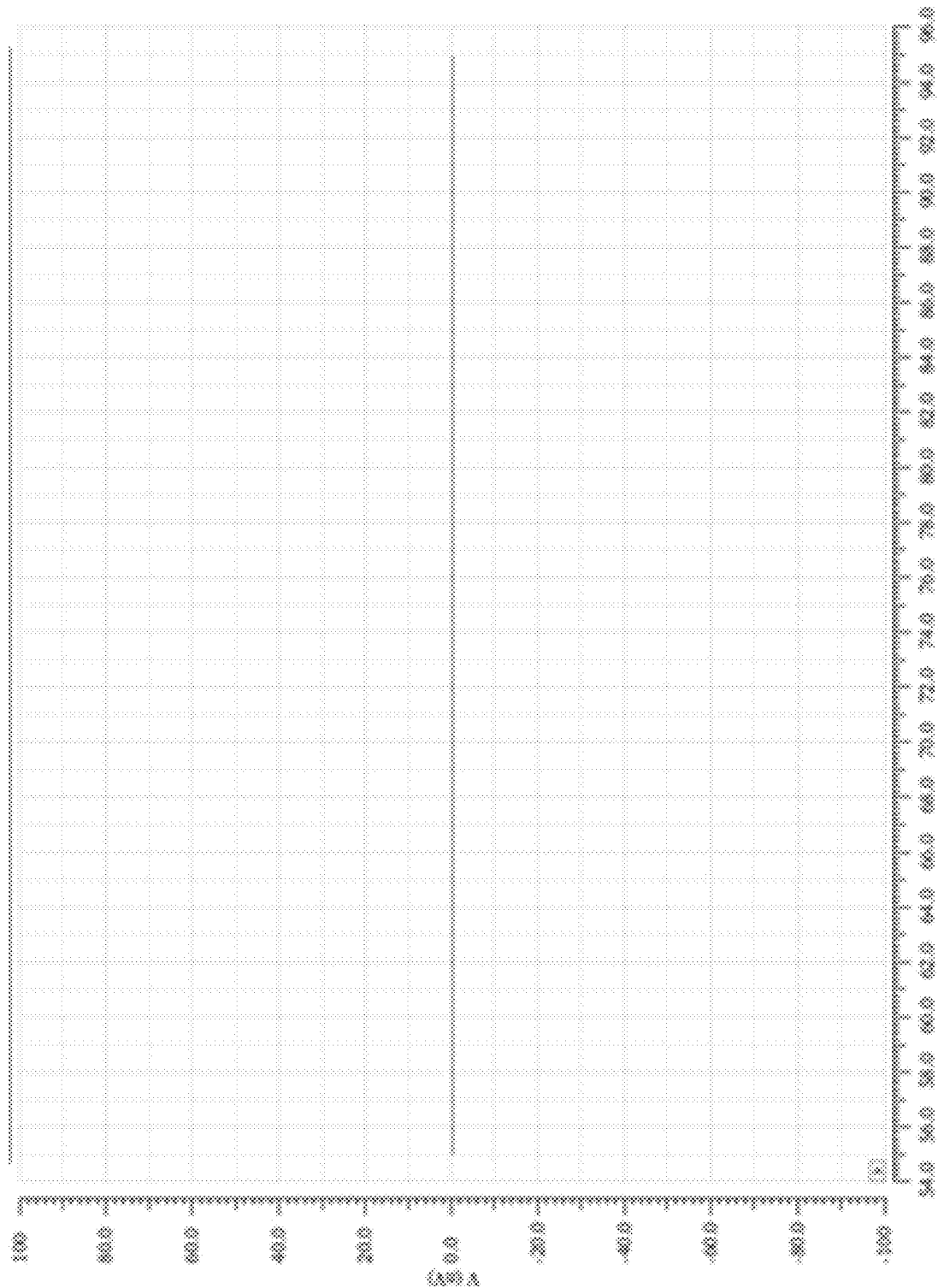

FIGS. 11A, 11B, and 11C are graphs of example transfer curves and a linearity error for simulated process, voltage, and temperature variations for the SAR ADC system circuit of FIG. 1 in accordance with implementations of this disclosure. The simulated transfer curve versus input voltages on three process corners (FF, TT, and SS), and variations on supply voltage (1.8V±0.2V), and temperature (−20° C.-125° C.). This plot indicates that the linearity error is zero under these PVT variations.

Figure 12:
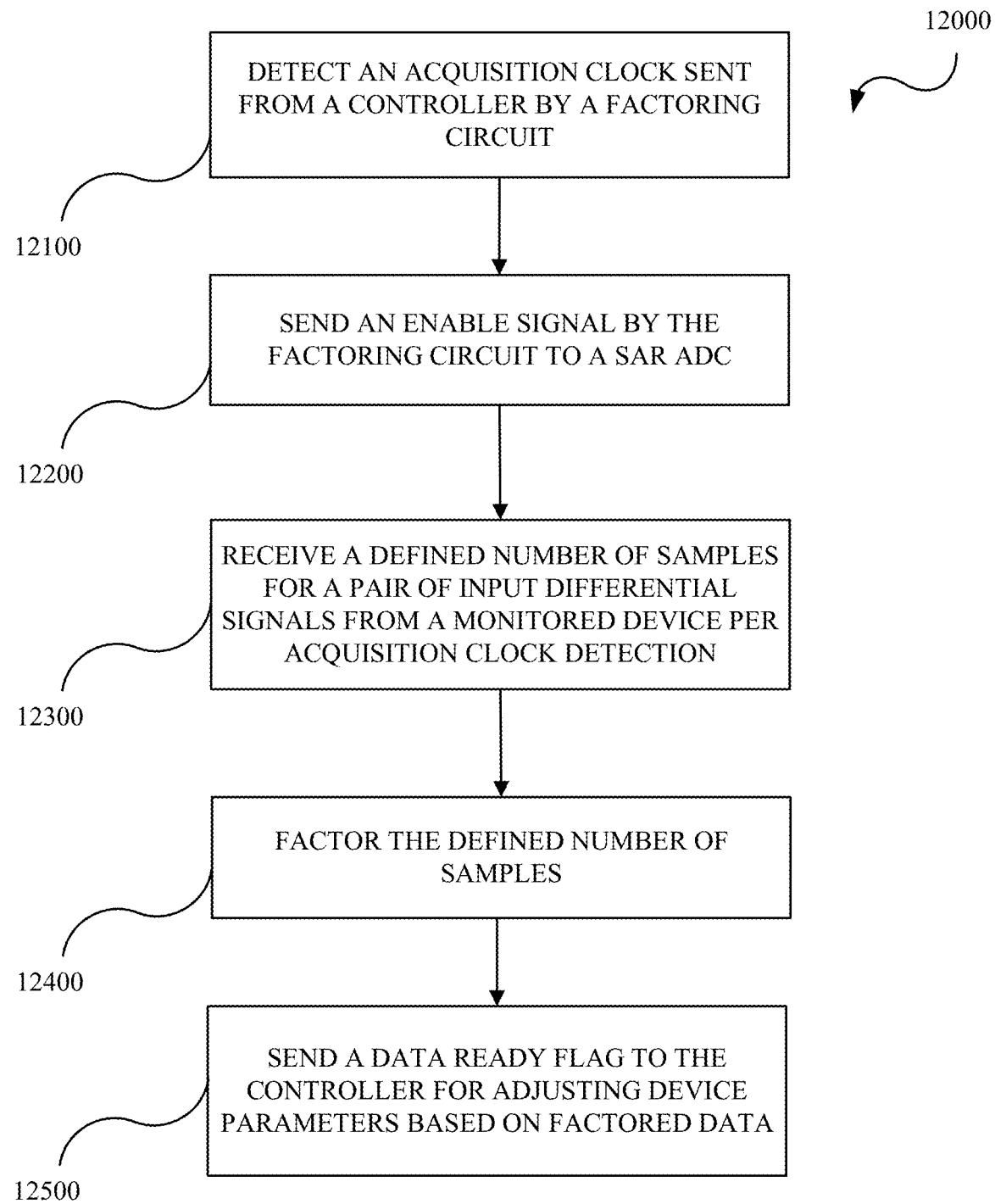
FIG. 12 is a flowchart of an example technique for factoring and background clock calibration in a SAR ADC system circuit in accordance with embodiments of this disclosure.

FIG. 12 is a flowchart of an example method 12000 for factoring and background clock calibration in a SAR ADC system circuit in accordance with embodiments of this disclosure. The method 12000 includes: detecting 12100 an acquisition clock sent from a controller by a factoring circuit; sending 12200 an enable signal by the factoring circuit to a SAR ADC; receiving 12300 a defined number of samples for a pair of input differential signal from a monitored device per acquisition clock detection; factoring 12400 the defined number of samples; sending 12500 a data ready flag to the controller for adjusting device parameters based on factored data. The method 12000 can be implemented by the SAR ADC system circuit 1000 of FIG. 1, the FSM 2000 of FIG. 2, the factoring circuit 4000 of FIG. 4, the FRO 5000 of FIG. 5, the FSM 6000 of FIG. 6, the asynchronous clock generator 8000 of FIG. 8A, the decoder circuit 8800 of FIG. 8B, and the FSM 8900 of FIG. 8C, as appropriate and applicable.

The method 12000 includes detecting 12100 an acquisition clock sent from a controller by a factoring circuit. A controller uses signals from devices to adjust device parameters. These signals, in the form of differential input signals, need to be digitized for use by the controller. The controller sends an acquisition clock, a trigger, a trigger pulse, a clock pulse, and the like (collectively "acquisition clock") set to a voltage representing a first logic state to initiate acquisition of multiple samples of an input differential signal. In implementations, the first logic state is a high logic state and a second logic state is a low logic state.

The method 12000 includes sending 12200 an enable signal by the factoring circuit to a SAR ADC. Upon detection of the high logic state of the acquisition clock, the factoring circuit sends an enable signal to the SAR ADC to start sampling the input differential signal at a sampling clock. The factoring circuit is configured by an accumulator controller to accumulate and factor a defined number of samples. The accumulator controller also sets a division factor value. The defined number of samples is also used to set a threshold for a FRO, which provides a base clock for generating the sampling clock. The FRO is calibrated when the acquisition clock is in a low logic state. The FRO calibration process sets the base clock by determining if the number of clocks or clock pulses meets or exceeds the threshold. A DCC then generates the sampling clock from the base clock. The sampling clock is fed to the SAR ADC.

The method 12000 includes receiving 12300 a defined number of samples for a pair of input differential signals from a monitored device per acquisition clock detection and factoring 12400 the defined number of samples. The factoring circuit is aware of a settling time associated with the SAR ADC and sends an enable for factoring signal to the SAR ADC after expiration of the setting time. The SAR ADC samples the input differential signal for the defined number of samples during a sampling phase of the sampling clock. The SAR ADC converts each of the samples using a fast clock which is calibrated when the acquisition clock is in a low logic state. The fast clock calibration process sets the fast clock by monitoring a logic state of a last bit flag for a sample. The logic state of the last bit flag is set to a first state if the last bit of the sample is resolved within the conversion phase. In implementations, the first state is a high logic state and a second state is a low logic state. If the logic state is a low logic state, then the frequency of the fast clock is increased until the last bit flag is a high logic state. The factoring circuit receives a factoring clock from the SAR ADC for capturing the data from the SAR ADC. The capturing, accumulating, and factoring of the data is initiated after the sending of the enable for factoring flag.

The method 12000 includes sending 12500 a data ready flag to the controller for adjusting device parameters based on factored data. The factoring unit sends a data ready flag to the controller once the factored data is ready. The controller uses the factored data to adjust parameters of the monitored device.

In general, a circuit includes a successive approximation register (SAR) analog to digital converter (ADC) (SAR ADC) configured to, in response to receiving an enable flag based on detection of an acquisition clock with a first logic state sent by a controller, sample and convert a pair of differential input signals using a sampling clock to obtain a defined number of samples in an acquisition clock cycle, and a factoring circuit configured to obtain the defined number of samples from the SAR ADC using a capturing clock based on the sampling clock, factor the defined number of samples, and send a factored samples ready flag to the controller. In implementations, the factoring circuit configured to detect the acquisition clock with the first logic state, send the enable flag to the SAR ADC, and send an enabling for factoring flag after waiting a settling time associated with the SAR ADC. In implementations, the circuit further includes an accumulator controller configured to set a factor type for the factoring circuit by provisioning the defined number of samples and a division factor, where a relationship between the defined number of samples and the division factor defines the factor type. In implementations, the circuit further includes an oscillation calibration circuit configured to adjust a frequency of an oscillator clock by comparing a number of clocks for a set frequency against a defined threshold when the acquisition clock is in a second logic state, wherein the defined threshold is based on the defined number of samples. In implementations, the circuit further includes a duty cycle corrector configured to generate the sampling clock from the oscillator clock, wherein a duty cycle of the sampling clock is asynchronous. In implementations, the circuit further includes a fast clock calibration circuit configured to adjust a frequency of a fast clock in the SAR ADC by monitoring a logic state of a last bit flag during a conversion phase of the sampling clock when the acquisition clock is in a second logic state, wherein the fast clock calibration circuit is configured to adjust the frequency of the fast clock when the last bit flag is in a second logic state. In implementations, the circuit further includes a state machine configured to operate responsive to at least the acquisition clock to maintain a set of successive states including at least a factoring state and a calibration state, wherein the state machine is operatively connected to the controller, the factoring circuit, the oscillator calibration circuit, and the fast clock calibration circuit. In implementations, the factoring circuit further includes a factoring determination circuit configured to factor the defined number of samples saved in an accumulator and output the factored samples to output registers.

In general, a device includes a factoring circuit configured to send an enable signal to an asynchronous successive approximation register (SAR) analog to digital converter (ADC) (SAR ADC) in response to detection of a trigger from a controller, send an enabling for factoring signal to the asynchronous SAR ADC after waiting a settling time associated with the asynchronous SAR ADC, and obtain a defined number of samples from the asynchronous SAR ADC within a processing cycle associated with the trigger, the defined number of samples sampled from a pair of differential input signals, and factor the defined number of samples for outputting to the controller. In implementations, the device further includes an accumulator controller configured to set the defined number of samples and a division factor, where a relationship between the defined number of samples and the division factor defines a type of factoring. In implementations, the device further includes an oscillation calibration circuit configured to adjust a frequency of an oscillator clock by comparing a number of clocks for a set frequency against a defined threshold on a falling edge of the trigger, wherein the defined threshold is based on the defined number of samples. In implementations, the device further includes a fast clock calibration circuit configured to adjust a frequency of a fast clock in the asynchronous SAR ADC by monitoring a last bit flag during a conversion phase of the sampling clock on a falling edge of the trigger, wherein the fast clock calibration circuit is configured to adjust the frequency of the fast clock when the last bit flag indicates inability to resolve a last bit. In implementations, the device further includes a state machine configured to operate responsive to at least the trigger to maintain a set of successive states including at least a factoring state and a calibration state, wherein the state machine is operatively connected to the controller, the factoring circuit, the oscillator calibration circuit, and the fast clock calibration circuit. In implementations, the factoring circuit further includes a factoring determination circuit configured to factor the defined number of samples saved in an accumulator and output the factored samples to output registers.

In general, a method includes detecting, by a factoring circuit, a high logic state of an acquisition clock sent from a controller, sending, by a factoring circuit, an enable signal to an asynchronous successive approximation register (SAR) analog to digital converter (ADC) (SAR ADC), obtaining, by the factoring circuit, a defined number of samples of a pair of input differential signal from a monitored device per acquisition clock detection, factoring, by the factoring circuit, the defined number of samples to generate factored data, and sending, by the factoring circuit to the controller, a data ready flag to enable adjusting of monitored device parameters based on the factored data. In implementations, the method further includes sending, by the factoring circuit, an enabling for factoring flag after waiting a settling time associated with the asynchronous SAR ADC, and receiving, by the factoring circuit from the asynchronous SAR ADC, a capturing clock based on a sampling clock to enable the factoring circuit to obtain the defined number of samples. In implementations, the method further includes setting, by an accumulator controller, a factoring configuration of the factoring circuit, wherein the factoring configuration is based on setting the defined number of samples and a division factor. In implementations, the method further includes calibrating, by an oscillator calibration circuit, an oscillator clock by comparing a number of clocks for a set frequency against a defined threshold when the acquisition clock is in a low logic state, wherein the defined threshold is based on the defined number of samples. In implementations, the method further includes calibrating, by a fast clock calibration circuit, a fast clock by monitoring a last bit during a conversion phase of a sampling clock when the acquisition clock is in a low logic state and adjusting the frequency of the fast clock when the last bit is unresolvable. In implementations, the method further includes transitioning, using a state machine, between at least a factoring state and a calibration state based on at least a logic state of the acquisition clock.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A circuit comprising:
   a successive approximation register (SAR) analog to digital converter (ADC) (SAR ADC) configured to, in response to receiving an enable flag based on detection of an acquisition clock with a first logic state sent by a controller, sample and convert a pair of differential input signals using a sampling clock to obtain a defined number of samples in an acquisition clock cycle; and
   a factoring circuit configured to
   obtain the defined number of samples from the SAR ADC using a capturing clock based on the sampling clock;
   factor the defined number of samples; and
   send a factored samples ready flag to the controller.

2. The circuit of claim 1, wherein the factoring circuit configured to detect the acquisition clock with the first logic state, send the enable flag to the SAR ADC, and send an enabling for factoring flag after waiting a settling time associated with the SAR ADC.

3. The circuit of claim 1, further comprising an accumulator controller configured to set a factor type for the factoring circuit by provisioning the defined number of samples and a division factor, where a relationship between the defined number of samples and the division factor defines the factor type.

4. The circuit of claim 1, further comprising an oscillation calibration circuit configured to adjust a frequency of an oscillator clock by comparing a number of clocks for a set frequency against a defined threshold when the acquisition clock is in a second logic state, wherein the defined threshold is based on the defined number of samples.

5. The circuit of claim 1, further comprising a duty cycle corrector configured to generate the sampling clock from the oscillator clock, wherein a duty cycle of the sampling clock is asynchronous.

6. The circuit of claim 1, further comprising a fast clock calibration circuit configured to adjust a frequency of a fast clock in the SAR ADC by monitoring a logic state of a last bit flag during a conversion phase of the sampling clock when the acquisition clock is in a second logic state, wherein the fast clock calibration circuit is configured to adjust the frequency of the fast clock when the last bit flag is in a second logic state.

7. The circuit of claim 1, further comprising a state machine configured to operate responsive to at least the acquisition clock to maintain a set of successive states including at least a factoring state and a calibration state.

8. The circuit of claim 1, wherein the factoring circuit further comprising a factoring determination circuit configured to factor the defined number of samples saved in an accumulator and output the factored samples to output registers.

9. A device comprising:
   a factoring circuit configured to:
   send an enable signal to an asynchronous successive approximation register (SAR) analog to digital converter (ADC) (SAR ADC) in response to detection of a trigger sent from a controller;
   send an enabling for factoring signal to the asynchronous SAR ADC after waiting a settling time associated with the asynchronous SAR ADC;
   obtain a defined number of samples from the asynchronous SAR ADC within a processing cycle associated with the trigger, the defined number of samples sampled from a pair of differential input signals; and
   factor the defined number of samples for outputting to the controller.

10. The device of claim 9, further comprising an accumulator controller configured to set the defined number of samples and a division factor, where a relationship between the defined number of samples and the division factor defines a type of factoring.

11. The device of claim 9, further comprising an oscillation calibration circuit configured to adjust a frequency of an oscillator clock by comparing a number of clocks for a set frequency against a defined threshold on a falling edge of the trigger, wherein the defined threshold is based on the defined number of samples.

12. The device of claim 9, further comprising a fast clock calibration circuit configured to adjust a frequency of a fast clock in the asynchronous SAR ADC by monitoring a last bit flag during a conversion phase of the sampling clock on a falling edge of the trigger, wherein the fast clock calibration circuit is configured to adjust the frequency of the fast clock when the last bit flag indicates inability to resolve a last bit.

13. The device of claim 9, further comprising a state machine configured to operate responsive to at least the trigger to maintain a set of successive states including at least a factoring state and a calibration state.

14. The device of claim 9, wherein the factoring circuit further comprising a factoring determination circuit configured to factor the defined number of samples saved in an accumulator and output the factored samples to output registers.

15. A method comprising:
   detecting, by a factoring circuit, a high logic state of an acquisition clock sent from a controller;
   sending, by a factoring circuit, an enable signal to an asynchronous successive approximation register (SAR) analog to digital converter (ADC) (SAR ADC);
   obtaining, by the factoring circuit, a defined number of samples of a pair of input differential signal from a monitored device per acquisition clock detection;
   factoring, by the factoring circuit, the defined number of samples to generate factored data; and
   sending, by the factoring circuit to the controller, a data ready flag to enable adjusting of monitored device parameters based on the factored data.

16. The method of claim 15, the method further comprising sending, by the factoring circuit, an enabling for factoring flag after waiting a settling time associated with the asynchronous SAR ADC, and receiving, by the factoring circuit from the asynchronous SAR ADC, a capturing clock based on a sampling clock to enable the factoring circuit to obtain the defined number of samples.

17. The method of claim 15, the method further comprising setting, by an accumulator controller, a factoring configuration of the factoring circuit, wherein the factoring configuration is based on setting the defined number of samples and a division factor.

18. The method of claim 15, the method further comprising calibrating, by an oscillator calibration circuit, an oscillator clock by comparing a number of clocks for a set frequency against a defined threshold when the acquisition clock is in a low logic state, wherein the defined threshold is based on the defined number of samples.

19. The method of claim 15, the method further comprising calibrating, by a fast clock calibration circuit, a fast clock by monitoring a last bit during a conversion phase of a sampling clock when the acquisition clock is in a low logic state and adjusting the frequency of the fast clock when the last bit is unresolvable.

20. The method of claim 15, the method further comprising transitioning, using a state machine, between at least a factoring state and a calibration state based on at least a logic state of the acquisition clock.

* * * * *